(12) United States Patent
O'Neill et al.

(10) Patent No.: US 7,074,489 B2
(45) Date of Patent: Jul. 11, 2006

(54) LOW DIELECTRIC CONSTANT MATERIAL AND METHOD OF PROCESSING BY CVD

(75) Inventors: Mark Leonard O'Neill, Allentown, PA (US); Aaron Scott Lukas, Allentown, PA (US); Mark Daniel Bitner, Nazareth, PA (US); Jean Louise Vincent, Bethlehem, PA (US); Raymond Nicholas Vrtis, Allentown, PA (US); Brian K. Peterson, Fogelsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 395 days.

(21) Appl. No.: 10/317,807

(22) Filed: Dec. 12, 2002

(65) Prior Publication Data

US 2003/0162034 A1    Aug. 28, 2003

Related U.S. Application Data

(63) Continuation-in-part of application No. 09/863,150, filed on May 23, 2001, now Pat. No. 6,716,770.

(51) Int. Cl.
    *B32B 9/04* (2006.01)
(52) U.S. Cl. .................. 428/447; 428/446; 428/697
(58) Field of Classification Search ............... 428/446, 428/447, 448, 209, 697
    See application file for complete search history.

(56) References Cited

U.S. PATENT DOCUMENTS

| 5,194,648 A | * | 3/1993 | Satoh et al. ............... 556/442 |
| 5,429,995 A | | 7/1995 | Nishiyama et al. |
| 5,571,576 A | | 11/1996 | Qian et al. ............... 427/574 |
| 5,661,093 A | | 8/1997 | Ravi et al. ............... 438/763 |
| 5,700,736 A | | 12/1997 | Muroyama ............... 438/622 |
| 5,703,404 A | | 12/1997 | Matsuura ............... 257/758 |
| 5,800,877 A | | 9/1998 | Maeda et al. ............... 427/535 |
| 5,827,785 A | | 10/1998 | Bhah et al. ............... 438/784 |

(Continued)

FOREIGN PATENT DOCUMENTS

EP           0 730 298 A2       9/1996

(Continued)

OTHER PUBLICATIONS

J. H. Golden, et al., "Addressing the Challenges of Spin-On Low-k Dielectric Dispense Management," Micromagazine.com (2001).

(Continued)

*Primary Examiner*—Stephen Stein
(74) *Attorney, Agent, or Firm*—Rosaleen P. Morris-Oskanian

(57) ABSTRACT

Organofluorosilicate glass films contain both organic species and inorganic fluorines, exclusive of significant amounts of fluorocarbon species. Preferred films are represented by the formula $Si_vO_wC_xH_yF_z$, where v+w+x+y+z=100%, v is from 10 to 35 atomic %, w is from 10 to 65 atomic % y is from 10 to 50 atomic %, x is from 1 to 30 atomic %, z is from 0.1 to 15 atomic %, and x/z is optionally greater than 0.25, wherein substantially none of the fluorine is bonded to the carbon. In one embodiment there is provided a CVD method that includes: providing a substrate within a vacuum chamber; introducing into the vacuum chamber gaseous reagents including a fluorine-providing gas, an oxygen-providing gas and at least one precursor gas selected from an organosilane and an organosiloxane; and applying energy to the gaseous reagents in the chamber to induce reaction of the gaseous reagents and to form the film on the substrate.

31 Claims, 9 Drawing Sheets

U.S. PATENT DOCUMENTS

| | | | |
|---|---|---|---|
| 5,872,065 A | 2/1999 | Sivaramakrishnan | 438/784 |
| 5,976,973 A | 11/1999 | Ohira et al. | |
| 5,989,998 A | 11/1999 | Sugahara et al. | 438/623 |
| 6,054,379 A | 4/2000 | Yau et al. | 438/623 |
| 6,072,227 A | 6/2000 | Yau et al. | 257/642 |
| 6,077,574 A | 6/2000 | Usami | 427/579 |
| 6,147,009 A | 11/2000 | Grill et al. | 438/780 |
| 6,159,871 A | 12/2000 | Loboda et al. | 438/786 |
| 6,197,706 B1 | 3/2001 | Li et al. | 438/789 |
| 6,316,063 B1 | 11/2001 | Andideh et al. | 427/577 |
| 6,410,463 B1 | 6/2002 | Matsuki | 438/790 |
| 2002/0173172 A1 | 11/2002 | Loboda et al. | |

FOREIGN PATENT DOCUMENTS

| | | |
|---|---|---|
| EP | 0 960 958 A2 | 12/1999 |
| JP | 96321499 | 12/1996 |
| JP | 8150036 | 6/1998 |
| JP | 99111712 | 4/1999 |
| JP | 99111714 | 4/1999 |
| WO | WO9941423 | 8/1999 |
| WO | WO 02/77320 A1 | 10/2002 |

OTHER PUBLICATIONS

Y. Uchida, et al., "A Fluorinated Organic-Silica Film with Extremely Low Dielectric Constant," Japanese Journal of Applied Physics, vol. 38 (1999), pp. 2368-2372.

Y. Uchida, et al., "Chemical-Vapor Deposition of OH-free and Low-k Organic-Silica Films," Japanese Journal of Applied Physics, vol. 37 (1998), pp. 6369-6373.

Y. Uchida, et al., "Preparation of Fluorinated Organic-Silica Films from Gas-Phase," Electrochemical Soc. Proceedings, vol. 98-3, pp. 163-168.

T. Shirafuji, et al., "Plasma Copolymerization of Tetrafluoroethylene/Hexamethyldisiloxane and In Situ Fourier Transform Infrared Spectroscopy of Its Gas Phase," Japanese Journal of Applied Physics, vol. 38 (199), pp. 4520-4526.

K. H. Kim, et al., "Dielectric Properties of SiCF Film Deposited by PECVD With Low Dielectric Constants," IEEE International Conference on Conduction and Breakdown in Solid Dielectrics (1998), pp. 229-232.

S. Hasegawa, et al., "Effects of Nitrogen Addition to Fluorinated Silicon Dioxide Films," Jpn. J. Appl. Phys., vol., 37 (1998), pp. 4904-4909.

J. Lubguban, Jr., et al., "Thermal Stability and Breakdown Strength of Carbon-Doped $SiO_2$:F films prepared by plasma-enhanced chemical vapor deposition method," Journal of Applied Physics, vol., 87, No. 8 (2000), pp. 3715-3722.

J. Lubguban, Jr., et al., "Stability of the Dielectric Properties of PECVD Deposited Carbon-Doped SiOF Films," Thin Solid Films 337 (1999), pp. 67-70.

J. Lubguban, Jr., et al., "Deposition of $SiO_2$:F:C With Low Dielectric Constant and With High Resistance to Annealing," Mat. Res. Soc. Symp. Proc., vol. 606, pp. 57-62.

T. Shirafuji, et al., "PE-CVD of Fluorocarbon/SiO Composite Thin Films Using $C_4F_8$ and HMDSO[1]," Plasmas and Polymers, vol. 4, No. 1 (1999), pp. 57-75.

S.M. Yun, et al., "Low Dielectric Constant CF/SiOF Composite Film Deposition in a Helicon Plasma Reactor," Thin Solid Films 341 (1999), pp. 109-111).

P.T. Liu, et al., "Effective Strategy for Porous Organosilicate to Suppress Oxygen Ashing Damage," Electrochemical and Solid-State Letters, 5(3), pp. G11-G14 (2002).

J. Lubguban, Jr., et al., "Deposition of $SiO_2$:F:C With Low Dielectric Constant and With High Resistance to Annealing," Mat. Res. Soc. Symp. Proc., vol. 606, pp. 57-62 (2000).

European Search Report No. 03028113.3-2119 dated Mar. 22, 2004.

Australian Search Report No. 200307095-0 dated Jul. 8, 2004.

* cited by examiner

LOW DIELECTRIC CONSTANT MATERIAL AND METHOD OF PROCESSING BY CVD

CROSS-REFERENCE TO RELATED APPLICATIONS

This application is a continuation-in-part of patent application Ser. No. 09/863,150, now U.S. Pat. No. 6,716,770, filed 23 May 2001, the disclosure of which is incorporated by reference herein in its entirety.

BACKGROUND OF THE INVENTION

The electronics industry utilizes dielectric materials as insulating layers between circuits and components of integrated circuits and associated electronic devices. Line dimensions are being reduced in order to increase speed and storage capability of microelectronic devices (e.g., computer chips). Microchip dimensions have undergone a significant decrease even in the past decade such that line widths previously greater than 1 micron are being decreased to 0.18 microns, with future plans on the drawing boards of at least as low as 0.07 microns. The time delay expression $T=\frac{1}{2} RCL^2$, where T is the delay time, R is the resistance of the conductive line, C is the capacitance of the dielectric layer, and L is the wire length, is often used to define the effects that changes in dimensions and materials can have on the propagation of signals in a circuit. The capacitance can be expressed as $C=k_0 k (S/d)$, where $k_0$ is the vacuum permitivity or dielectric constant (equal to 1.0), k is the dielectric constant for the thin film, S is the electrode surface area and d is the film thickness. Thus, a decrease in k will result in a proportional reduction in C and consequently a reduction in delay time. Further, as the line dimensions decrease, better insulating materials with lower dielectric constants are also needed to prevent signal crossover (aka crosstalk) between the chip components, which can have a negative effect on performance.

Historically, silica with a dielectric constant (k) of 4.2–4.5 has been employed as the interlayer dielectric (ILD). However at line dimensions of 0.25 microns and less, silica may no longer be acceptable, and it has been extensively replaced by other materials, such as fluorinated silica glass (FSG) wherein k is about 3.6. The addition of fluorine to silica specifically aimed at reducing the k value from that of undoped silica has been studied for the past few years (see, e.g., U.S. Pat. Nos. 5,571,576, 5,661,093, 5,700,736, 5,703,404, 5,827,785 and 5,872,065). The high electronegativity of fluorine results in a very non-polarizable species, which reduces the dielectric constant. Fluorinated silica has gained acceptance in the industry and is being used for the current generation of ICs.

While fluorinated silica materials have the requisite thermal and mechanical stability to withstand very high temperatures (up to 500° C.), the materials' properties (e.g., low water sorption, mechanical properties) are susceptible to being compromised when large amounts of fluorine are incorporated into the material. Fluorinated organic materials, such as poly(tetrafluoroethylene) despite having very low k values down to 2.0 or less, have not shown sufficient stability to the temperatures experienced during subsequent processing steps involved in the manufacture of an integrated circuit. Organic polymers in general do not possess sufficient mechanical strength for processing under current conditions. As well, fluorocarbon polymers can have other drawbacks such as poor adhesion, potential reaction with metals at high temperature, and poor rigidity at high temperature in some cases. In order to achieve the desired property characteristics and low dielectric constant values, silica based dielectric films which incorporate both organic dopants and inorganic fluorine species may provide for films with k values lower than FSG, and better thermal and mechanical properties than organosilica glass (OSG) materials, while maintaining the requisite properties to function as an interlayer/intermetal material in IC manufacturing.

More recently, OSG is being sought as the replacement for FSG. OSG materials are being touted as the future interlayer/intermetal dielectric of choice produced by CVD techniques. Numerous patents have been issued covering the use of various organosilanes for the production of thin films with k values of about 2.7–3.2 (see, e.g., U.S. Pat. Nos. 5,989,998, 6,054,379, 6,072,227, 6,147,009 and U.S. Pat. No. 6,159,871, and WO 99/41423). OSG thin film dielectric materials are being commercialized and/or advertised by several leading OEMs for future ICs due to their inherently lower k (<3.2) relative to FSG. However, the reduction in k must be balanced against detrimental effects that organic species typically have, which include reduced mechanical properties, thermal stability and chemical resistance. Studies have indicated that the preferred materials properties for OSG limit the dielectric constant to the range of 2.8–3.2 with modulus/hardness values in the, range of 9–11/1.2–1.4 GPa (see Lee et al., 198$^{th}$ Meeting of The Electrochemical Society, October 2000, Section H-1, Abstract No. 531; and Golden et al., MICRO, p. 31, February 2001).

Some recent literature and patents have proposed the use of carbon-doped FSG materials. Most of these examples exclusively utilize fluorocarbon materials as precursors in combination with a silicon precursor source, and incorporate fluorocarbon moieties into a silica or FSG framework. For example, Shirafuji et al. plasma copolymerized hexamethyidisiloxane with octafluorobutene (Plasmas and Polymers, 4(1) (57–75) March 1999 or tetrafluoroethylene (38 Jpn. J. Appl. Phys. 4520–26 (1999)) to produce fluorocarbon/SiO composite films in which k increased from 2.0 to 3.3 with decreasing fluorocarbon content. Yun et al. (341 (1,2) Thin Solid Films 109–11 (1999)) discuss the effects of fluorocarbon addition to SiOF films produced in a helicon plasma reactor using triethoxyfluorosilane and $O_2$.

Another example of the specific inclusion of fluorocarbon moieties in silica is the work of Kim et al., 1998 IEEE International Conference On Conduction and Breakdown in Solid Dielectrics 229–32 (1998), describing the ability of fluorocarbon addition to reduce the k of the material substantially from that of silica. The work of Kim et al. appears to be aimed specifically at incorporating fluorocarbon moieties through the use of $CF_4$ in a 2% silane/$N_2$ plasma to produce films containing silicon, oxygen, carbon, fluorine, and N, where they were able to identify Si—C, Si—N, Si—O, and C—F functionalities. They also found that there was a depth profile to their compositions, whereby the surface was higher in oxygen than the bulk.

U.S. Pat. No. 5,800,877 to Maeda et al. describes the use of a mixture of organosilane precursors having an Si—F bond and organosilane precursors without an Si—F bond, with ozone or oxygen, in a thermal process to produce a fluorine-containing silicon oxide film. The claims of this patent cover the production of a fluorine-containing silicon oxide via thermal process with an oxygen and/or nitrogen plasma post-treatment. The patent does not describe the incorporation of alkyl groups or carbon into the film.

In a paper by Hasegawa et al. (37 Jpn. J. Appl. Phys. 4904–09 (1998)), enhanced water resistance of fluorinated silica was the motivation for deposition using mixtures of silane, oxygen, $CF_4$ and ammonia in a plasma-enhanced CVD system. The deposited films were found to contain a significant amount of Si—N and C—F bonds, as interpreted by XPS spectra. Enhancing the water resistance via incorporation of Si—N will negatively impact the k value.

In similar works by the same group noted above, Lubguban et al. (337 Thin Solid Films 67–70 (1999), 606 Materials Research Society Symposium Proceedings 57 (2000), and 87(8) Journal of Applied Physics 3715–22 (2000)) discuss the introduction of carbon into fluorosilicate glass by PE-CVD to enhance water resistivity. The materials were synthesized from silane or TEOS, oxygen, methane and perfluoromethane, and were studied for composition, thermal stability, and electrical properties. Lubguban et al. suggest that the incorporation of both carbon and fluorine into a $SiO_2$ network reduces the dielectric constant. Increases in the amount of methane introduced to the deposition chamber during reaction resulted in increased carbon and fluorine in the final material, said to be caused by a significant contribution by C—F functionalities. As described in their papers, the presence of C—F and C—H species will promote resistance to water sorption and help to reduce dielectric constant.

In a Japanese patent by Fujitsu (JP10150036A2), organosilicon materials deposited by a spin coat method had a post-deposition treatment with $F_2$ or $NF_3$ in a plasma reactor to increase heat resistance, reduce water sorption, and increase material reliability of the film through the formation of fluorocarbon species in the film. Other Fujitsu patents (JP 8321499A2 and JP 11111712A2) also discuss the formation of silica films with incorporated fluorocarbon species by plasma CVD using silicon-based precursors containing fluorocarbon groups.

Uchida et al. disclose fluorinated organic-silica films for improved moisture tolerance. See, e.g., 98(3) Electrochem. Soc. 163–8 (1998), 37 Jpn. J. Appl. Phys. 6369–73 (1998), 38 Jpn. J. Appl. Phys. 2368–72 (1999) and JP 11111714A. In these papers, the authors indicate that the properties of FSG and OSG may be complementary, such that a material that has both functionalities may take advantage of their strengths, although little supporting data is given. The authors attempt to show this asserted advantage by describing a process in which an organosilicon material was deposited in a thermal process from a mixture of tertiary methylamine (TMA), tetraisocyanate-silane (TICS), dimethyidiisocyanate-silane (DMSIC) and preferably dimethylethylamine (DMA), to produce H and OH—free silica films. This deposited film was post-treated with HF gas in a thermal process to replace isocyanate species with fluorine, and produced films with a lower dielectric constant and better moisture tolerance. The films produced, however, included C—Si and C—F functionalities. Also, as is typical in diffusional-based processes such as chemical post-treatments, there resulted a compositional gradient induced through the depth of the film. It is inherently difficult to control the amount and uniformity of the chemical modification through the film in this manner.

U.S. Pat. No. 6,077,574 to Usami discloses processes for forming a plasma CVD silicon oxide dielectric film doped with specified amounts of fluorine and carbon, wherein the film is deposited from a mixture of feed gases, which can control the fluorine concentration and the carbon concentration independently of each other. The atomic ratio ([carbon]/[fluorine]) in these films is less than or equal to 0.25, based on the disclosed concentration ranges of $4.0 \times 10^{21}$ fluorine atoms/cc to $1.0 \times 10^{22}$ fluorine atoms/cc, and $3.0 \times 10^{19}$ carbon atoms/cc to $1.0 \times 10^{21}$ carbon atoms/cc. No data are presented regarding the functionalities formed within the film. Given that the density of silica is about 2.2 grams/cc, which is equivalent to $6.6 \times 10^{22}$ atoms/cc, the concentration of fluorine and carbon can be estimated to be about 6–15 atomic % fluorine and about 0.05 to 1.5 atomic % carbon.

U.S. Pat. No. 6,410,463 to Matsuki discloses a method for forming a low dielectric constant film that increases the residence time of the reaction gas in the reactor to at least 100 msec. Matsuki does not disclose the use of an oxygen-providing gas (e.g., $O_2$) in the production of the film.

Despite the foregoing developments, there have not been any examples in the prior art that successfully combine the desired mechanical, dielectric, thermal and oxidative stability properties that are paramount for integrating low k dielectric materials in integrated circuits.

All references cited herein are incorporated herein by reference in their entireties.

BRIEF SUMMARY OF THE INVENTION

The invention provides films of carbon-doped fluorosilicate glass (i.e., CFSG or OFSG—organofluorosilicate glass) containing both organic species and inorganic fluorines, exclusive of significant amounts of fluorocarbon species.

In one embodiment of the present invention, there is provided a film represented by the formula $Si_vO_wC_xH_yF_z$, where v+w+x+y+z=100%, v is from 10 to 35 atomic from 10 to 65 atomic %, y is from 10 to 50 atomic %, x is from 2 to 30 atomic %, and z is from 0.1 to 15 atomic % and wherein substantially none of the fluorine is bonded to the carbon.

In a further embodiment of the present invention, there is provided a filmrepresented by the formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, provided that x/z>0.25, wherein substantially none of the fluorine is bonded to the carbon.

In a still further embodiment of the present invention, there is provided a film represented by the formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, and wherein 0.5 atomic % or less of the fluorine is bonded to the carbon and wherein the film may resist alteration of a film property by an environmental condition.

In yet another embodiment of the present invention, there is provided a film represented by the formula where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, provided that x/z>0.25, wherein 0.5 atomic % or less of the fluorine is bonded to the carbon, and wherein the film may resist alteration of a film property by a microelectronic processing step. dr

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1A:
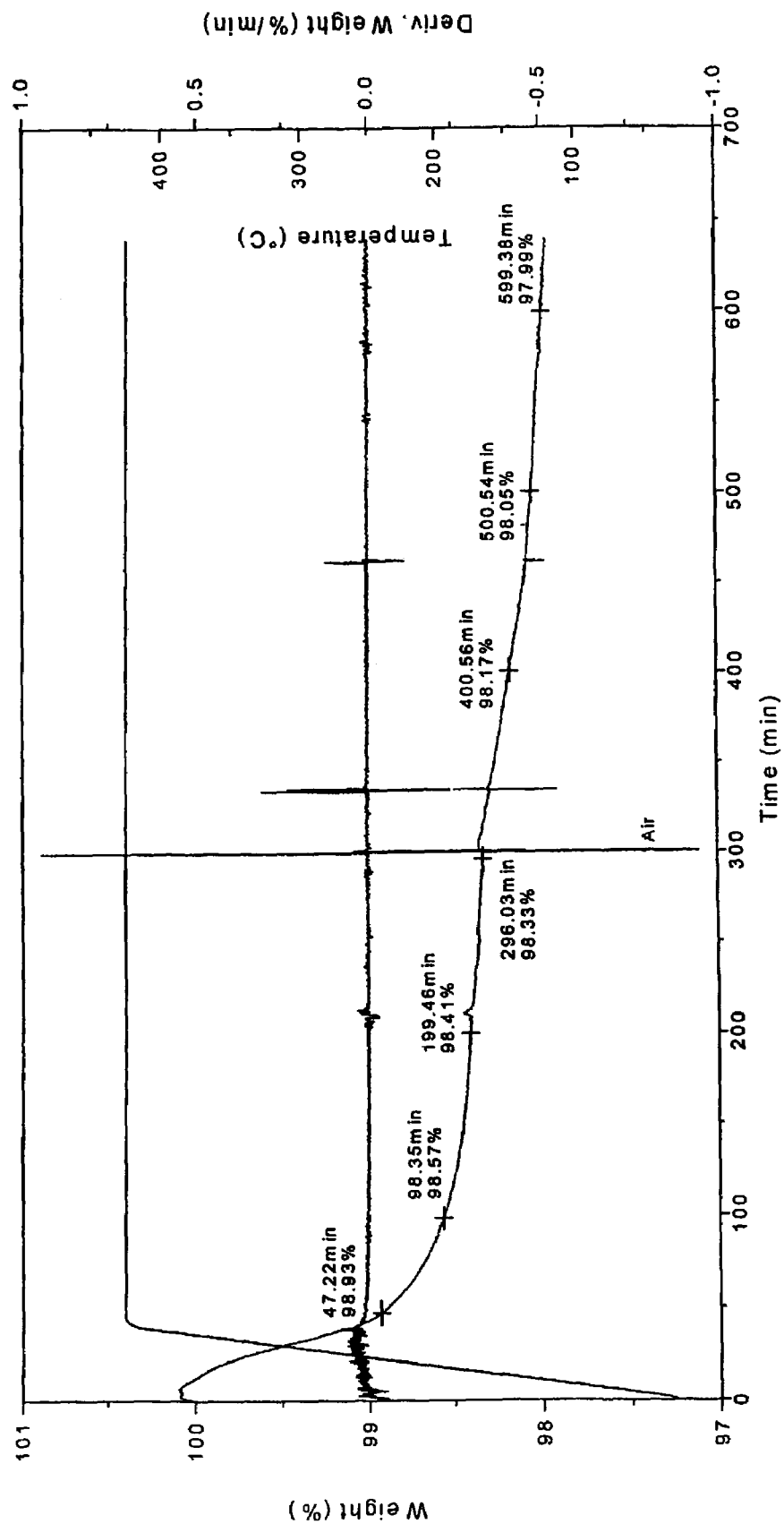
FIG. 1a shows an isothermal thermogravimetric analysis (TGA) of an embodiment of a film of the invention.
Figure 1B:
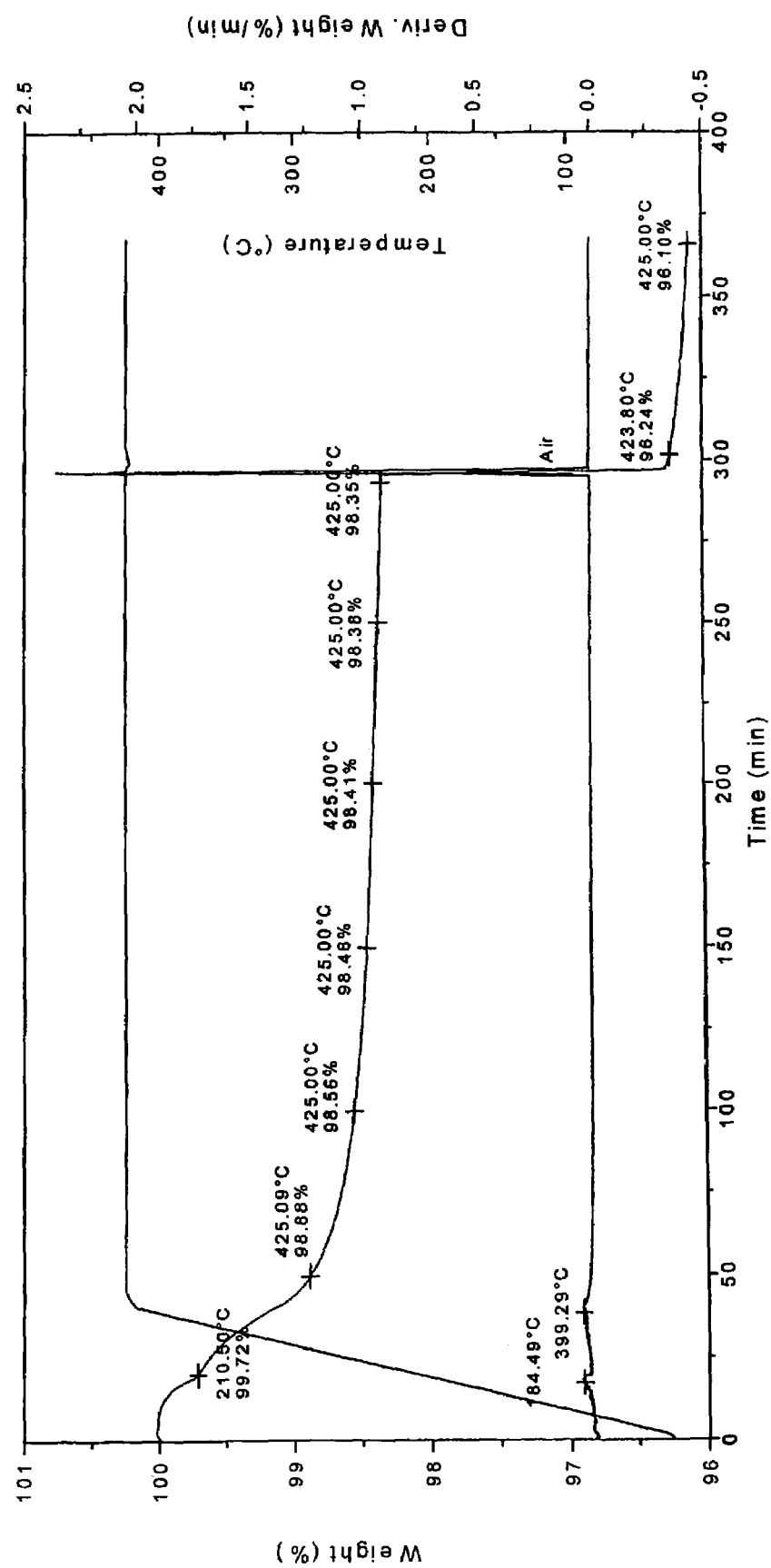
FIG. 1b shows an isothermal TGA of a prior art film.

Preferred embodiments of the invention provide a thin film material having a low dielectric constant and improved mechanical properties, thermal stability, and chemical resistance (to oxygen, aqueous environments, etc.) relative to OSG materials. This is the result of the incorporation into the film of carbon (which may be silicon carbide, but is preferably predominantly in the form of organic carbon, —CHx, where x is 1 to 3) and inorganic fluorine (e.g., Si—F bonds) without the production of significant amounts of organic fluorine (e.g., C—F bonds). Thus, the final thin film material preferably comprises Si—O, Si—F, C—H and Si—C bonding structure, substantially free of, and more preferably completely free of any C—F bonds, and preferably most of the hydrogen is bonded to carbon. In quantitative terms, a preferred film of the invention contains 0.5 atomic % or less, preferably 0.1 atomic % of less, and more preferably 0.1 atomic % or less of the fluorine present in the film bonded to carbon. Lesser portions of other functionalities, such as, e.g., Si—H, C—O and O—H, may also be present in certain films of the invention.

Thus, preferred embodiments of the invention comprise: (a) about 10 to about 35 atomic %, more preferably about 20 to about 30% silicon; (b) about 10 to about 65 atomic %, more preferably about 20 to about 40 atomic % oxygen; (c) about 10 to about 50 atomic %, more preferably about 20 to about 40 atomic % hydrogen; (d) about 1 to about 30 atomic %, more preferably about 5 to about 25 atomic % carbon; and (e) about 0.1 to about 15 atomic %, more preferably about 0.5 to about 7.0 atomic % fluorine. Lesser portions of other elements may also be present in certain films of the invention.

Both FSG and OSG materials are considered to be low k materials as their dielectric constant is less than that of the standard material traditionally used in the industry—silica glass. The combination of both inorganic fluorine and organic carbon doping to the film results in a coupled effect on the k of the final material. This may manifest itself in different ways. For example, the film may be of comparable mechanical properties as an OSG material but with a lower k, or may be of comparable k but with superior mechanical properties.

Incorporation of methyl groups into a silica film may impart nanoporosity to the film, which helps to reduce the k of the film, but can also reduce the mechanical properties of the film. Films of the invention preferably contain about 1 to about 30 atomic % carbon or about 2 to about 30 atomic % carbon, wherein most of the hydrogen is attached to carbon. Preferably, a portion of the C—H functionalities are in methyl groups. In general, the introduction of porosity is an effective method to reduce the dielectric constant of a material. While the addition of porosity will impact the mechanical and heat transfer properties of the film (e.g., extensive properties), it will not change the inherent chemical or thermal stability of the film.

Certain embodiments of the films are nanoporous relative to silica. Silica produced by PE-CVD TEOS has an inherent free volume pore size determined by positron annihilation lifetime spectroscopy (PALS) analysis to be about 0.6 nm in equivalent spherical diameter. The pore size of the inventive films as determined by small angle neutron scattering (SANS) or PALS is preferably less than 5 nm in equivalent spherical diameter, more preferably less than 2.5 nm in equivalent spherical diameter.

Films of the invention preferably have a density of less than 2.0 g/cc, or alternatively, less than 1.5 g/cc. Such low densities can be achieved by adding a porogen to the gaseous reagents and/or post-treating the deposited material.

Films of the invention have improved properties relative to reference OSG materials or films. The term "reference OSG material" or "reference OSG film" as used herein has a substantially similar dielectric constant and/or stoichiometric composition as the OFSG material but for the absence of fluorine in the reference OSG material. A given OFSG material will have mechanical properties superior to those of a reference OSG material. For example, preferred embodiments of OFSG materials of the invention have a dielectric constant of less than 3.5, more preferably less than 3.0. In certain embodiments, the OFSG film of the present invention has a dielectric constant in the range from 2.8 to 3.2, with a modulus of elasticity greater than 10 GPa and/or a nanoindentation hardness greater than 1.5 GPa. By comparison, reference OSG films with a dielectric constant ranging from 2.8 to 3.2 may have a modulus of elasticity below 10 GPa and a nanoindentation hardness below 1.5 GPa (see supra Table 2, Comparative Examples 1, 2, 4, and 5).

Films of the invention are adapted to resist alteration of film properties by environmental conditions. Films of the invention are thermally stable, with good chemical resistance. In particular, the films have an average weight loss of less than 1.0 wt %/hr isothermal at 425° C. under $N_2$ and/or an average weight loss of less than 1.0 wt %/hr isothermal at 425° C. under air.

Microelectronic processing steps are typical examples of environmental conditions posing challenges to films. Such processing steps (e.g., thermal annealing, dielectric etching and post-etch ashing) can frequently be chemically and/or thermally oxidative. Films of the invention are more resistant to challenging environmental conditions than conventional OSG films. For example, films of the invention substantially maintain their dielectric constant throughout typical microelectronic processing steps. Preferably, the dielectric constant increases by less than 10% and/or 0.1. The dielectric constant preferably increases by less than an amount by which the environmental condition increases a reference dielectric constant of a reference OSG film. In certain embodiments, the dielectric constant increases by 50% or less, , preferably by 20% or less, or more preferably by 10% or less by an amount by which the environmental condition increases the dielectric constant of a reference OSG film.

Fluorine distribution, or the tendency of fluorine within the film to migrate to one or more adjacent layers, is another film property made resistant to environmental challenge in preferred embodiments.

Carbon concentration is still another film property made resistant to environmental challenge in preferred embodiments. The carbon concentration preferably decreases by less than an amount by which the environmental condition decreases a reference carbon concentration in a reference OSG film. For example, the carbon concentration can decrease by 50% or less, preferably by 20% or less, or more preferably 10% or less of an amount by which the environmental condition decreases the reference carbon concentration.

The films are suitable for a variety of uses. The films are particularly suitable for deposition on a semiconductor substrate, and are particularly suitable for use as, e.g., an insulation layer, an interlayer dielectric layer, an intermetal dielectric layer, a capping layer, a chemical-mechanical planarization (CMP) or etch stop layer, a barrier layer (e.g., against diffusion of metals, water or other materials that can be undesirable in insulating layers) and/or an adhesion layer in an integrated circuit. The films can form a conformal coating. The mechanical properties exhibited by these films make them particularly suitable for use in Al subtractive technology and Cu damascene technology.

The films are compatible with chemical mechanical planarization and anisotropic etching, and are capable of adhering to a variety of materials, such as silicon, $SiO_2$, $Si_3N_4$, OSG, FSG, silicon carbide, antireflective coatings, photoresists, organic polymers, porous organic and inorganic materials, metals such as copper and aluminum, and metal barrier layers.

Although the invention is particularly suitable for providing films and products of the invention are largely described herein as films, the invention is not limited thereto. Products of the invention can be provided in any form capable of being deposited by CVD, such as coatings, multilaminar assemblies, and other types of objects that are not necessarily planar or thin, and a multitude of objects not necessarily used in integrated circuits.

In addition to the inventive product, the present invention includes the process through which the product is made and methods of using the product.

In certain embodiments, the invention comprises an improved process for depositing OSG by chemical vapor deposition, wherein a source of inorganic fluorine codeposits inorganic fluorine during at least a portion of the deposition of an OSG material to produce a film substantially free of organic fluorine. Thus, the invention can be used to improve prior, contemporary and future processes, including those disclosed and claimed in U.S. Pat. Nos. 6,054,379, 6,147,009 and 6,159,871 and WO 99/41423. Products produced by the improved process enjoy improved properties relative to conventionally-produced products. Preferably, at least one mechanical property of the film is increased by at least 10%, the thermal stability of the film is increased, the chemical stability of the film is increased and/or the environmental stability of the film is increased.

The process to obtain a film having a low dielectric constant comprises the steps of: (a) providing a substrate within a vacuum chamber; (b) introducing into the vacuum chamber gaseous reagents including a fluorine-providing gas, an oxygen-providing gas and at least one precursor gas selected from the group consisting of an organosilane and an organosiloxane; and (c) applying energy to the gaseous reagents in said chamber to induce reaction of the gaseous reagents and to form the film on the substrate.

Preferably, the substrate is a semiconductor.

Organosilanes and organosiloxanes are the preferred precursor gases. Suitable organosilanes and organosiloxanes include, e.g: (a) alkylsilanes represented by the formula $R^1{}_n SiR^2{}_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane); (b) a linear organosiloxane represented by the formula $R^1(R^2{}_2SiO)_n SiR^2{}_3$ where n is an integer from 1 to 10, or cyclic organosiloxane represented by the formula $(R^1R^2SiO)_n$ where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^2(SiR^1R^2)_n R^2$ where n is an integer from 2 to 10, or cyclic organosilane represented by the formula $(SiR^1R^2)_n$, where n is an integer from 3 to 10, and $R^1$ and $R^2$ are as defined above (e.g., 1,2-dimethyidisilane, 1,1,2,2-tetramethyidisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane).

In certain embodiments, the organosilane/organosiloxane is a cyclic alkylsilane, a cyclic alkoxysilane or contains at least one alkoxy or alkyl bridge between a pair of silicon atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane.

In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate and di-tert-butoxydiacetoxysilane.

Preferred fluorine-providing gases lack any F—C bonds (i.e., fluorine bonded to carbon), which could end up in the film. Thus, preferred fluorine-providing gases include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing gases include the above mentioned alkylsilanes, alkoxysilanes, linear and cyclic organosiloxanes, linear and cyclic organosilane oligormers, cyclic or bridged organosilanes, and organosilanes with reactive side groups, provided a fluorine atom is substituted for at least one of the silicon substituents, such that there is at least one Si—F bond. More specifically, suitable fluorine-providing gases include, e.g., fluorotrimethylsilane, difluorodimethylsilane methyltrifluorosilane, flurotriethoxysilane, 1,2-difluoro-1,1,2,2,-tetramethyldisilane, or difluorodimethoxysilane.

Suitable oxygen-providing gases include, e.g., $O_2$, $N_2O$, ozone, hydrogen peroxide, NO, $NO_2$, $N_2O_4$, or mixtures thereof.

It is within the scope of the invention for a single species of molecule to function as more than one of the precursor gas, the oxygen-providing gas and the fluorine-providing gas. That is, the precursor gas, the oxygen-providing gas and the fluorine-providing gas are not necessarily three different gases. For example, it is possible to use dimethoxymethylfluorosilane to provide silicon, carbon, oxygen and fluorine. It is also possible to use a single gas to act as a precursor and oxygen-providing gas (e.g., tetraethoxysilane, trimethylsilylacetate or dimethoxydimethylsilane, each of which provides carbon, oxygen and silicon), to use a single gas to act as a precursor and a fluorine-providing gas (e.g., trimethylfluorosilane, which provides carbon, fluorine and silicon), etc. In any case, it is preferred to avoid the use of any reagents containing C—F functionalities.

Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor.

In certain embodiments, mixtures of different organosilanes and/or organosiloxanes are used in combination. It is also within the scope of the invention to use combinations of multiple different fluorine-providing gases and/or combinations of multiple different oxygen-providing agents along with or separate from combinations of different organosilanes and/or organosiloxanes. Moreover, it is also within the scope of the invention to use a fluorinated organosilane (to provide fluorine and/or carbon) along with a non-fluorinated organosilane (to provide carbon).

In addition to the fluorine-providing gas, the oxygen-providing gas and the organosilane/organosiloxane, additional materials can be charged into the vacuum chamber prior to, during and/or after the deposition reaction. Such materials include, e.g., inert gas (e.g., He, Ar, $N_2$, Kr, Xe, etc., which may be required as a carrier gas for lesser volatile precursors and/or which can promote the annealing of the as-deposited materials and provide a more stable final film) and reactive substances, such as gaseous or liquid organic substances, $NH_3$, $H_2$, $CO_2$, or CO. Organic substances, such as, e.g., $CH_4$, $C_2H_6$, $C_2H_4$, $C_2H_2$, $C_3H_8$, benzene, naphthalene, toluene and styrene and can provide carbon for inclusion in the inventive films.

Energy is applied to the gaseous reagents to induce the gases to react and to form the film on the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm$^2$, more preferably 0.3 to 3 watts/cm$^2$, based upon a surface area of the substrate.

The flow rate for each of the gaseous reagents preferably ranges from 10 to 5000 sccm, more preferably from 200 to 2000 sccm, per single 200 mm wafer. The individual rates are selected so as to provide the desired amounts and ratios of fluorine, carbon, etc. in the film. The actual flow rates needed may depend upon wafer size and chamber configuration, and are in no way limited to 200 mm wafers or single wafer chambers.

It is preferred to deposit the film at a deposition rate of at least 50 nm/min.

The pressure in the vacuum chamber during deposition is preferably 0.01 to 600 torr, more preferably 1 to 10 torr.

A preferred recipe of the invention based on using trimethyl silane as the organosilane precursor is shown in the Table 1 below for 200 mm silicon wafer substrate.

TABLE 1

| Pressure torr | 4.0 |
|---|---|
| Substrate temperature (° C.) | 350 |
| Spacing (mil) | 320 |
| RF power (Watts) | 400 |
| Trimethylsilane flow (sccm) | 540 |
| $O_2$ flow (sccm) | 90 |
| $SiF_4$ flow (sccm) | 250 |

Preferably, the inventive process is completed in a single process step with high throughput. Without wishing to be bound by any theories, it is believed that the process of the invention provides films having more uniform distribution of inorganic fluorine throughout the entire cross-section of the film, unlike multistep post-treatment fluorination processes, such as taught by Uchida et al. In addition, any insubstantial amounts of organic fluorine present in films of the invention (wherein "insubstantial" is herein defined for this purpose as being less than 5% of the total fluorine content, more preferably less than 1% of the total fluorine content) is also more uniformly distributed throughout the entire cross-section of the film and is not centrally concentrated.

Although a single process step is preferred in many instances, it is also within the scope of the invention to post-treat the film after deposition. Such post-treating can include, e.g., at least one of thermal treatment, plasma treatment and chemical treatment.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.,g., a 10 mm outermost edge of the substrate is not included in the statistical calculation of uniformity.

The porosity of the film can be increased with the bulk density being correspondingly decreased to cause further reduction in the dielectric constant of the material and extending the applicability of this material to future generations (e.g., k<2.5).

The invention will be illustrated in more detail with reference to the following Examples, but it should be understood that the present invention is not deemed to be limited thereto.

EXAMPLES

All experiments were performed on an Applied Materials Precision-5000 system in a 200 mm DxZ chamber fitted with an Advance Energy 2000 rf generator, using an undoped TEOS process kit. The recipe involved the following basic steps: initial set-up and stabilization of gas flows, deposition, and purge/evacuation of chamber prior to wafer removal. Subsequently, a chamber clean was performed after each deposition using an in situ $C_2F_6+O_2$ clean followed by a chamber seasoning step.

Dielectric constants were determined using Hg probe technique on low resistivity p-type wafers (<0.02 ohm-cm), mechanical properties were determined using MTS Nano Indenter, thermal stability and off-gas products were determined by thermogravimetric analysis on a Thermo TA Instruments 2050 TGA coupled to a MIDAC infrared spectrometer (TGA-IR). $^{13}$C-NMR data were obtained on a Bruker ASX-200, compositional data were obtained by x-ray photoelectron spectroscopy (XPS) on a Physical Electronics 5000LS.

Comparative Examples 1–6 were produced in accordance with the teachings of U.S. Pat. Nos. 6,159,871 and 6,054,379, and WO 99/41123, and are tabulated in Table 2 below.

TABLE 2

Data for OSG depositions from trimethylsilane and oxygen

| Comparative Example No. | 1 | 2 | 3 | 4 | 5 | 6 |
|---|---|---|---|---|---|---|
| Substrate Temp. (° C.) | 350 | 350 | 350 | 350 | 350 | 350 |
| Thickness (nm) | 668 | 633 | 661 | 669 | 1324 | 643 |
| Uniformity (+/−) | | 8 | 6 | 7 | 12 | 5 |
| Refractive Index | 1.442 | 1.439 | 1.444 | 1.441 | 1.431 | 1.4445 |
| Uniformity (+/−) | | 0.0073 | 0.0070 | 0.0090 | 0.0073 | 0.0047 |
| Average Cap./Hg (pF) | 38 | 39.1 | | 37.5 | 20.9 | |
| Dielectric Constant | 3.03 | 2.97 | | 2.99 | 3.02 | |
| Adhesion (Tape Pull) | 100% | 100% | 100% | 100% | 100% | 100% |
| Young's Modulus (GPa) | 8.7 | 9.0 | 8.4 | 7.6 | 7.1 | 8.2 |
| NI hardness (GPa) | 1.4 | 1.4 | 1.3 | 1.1 | 1.1 | 1.3 |
| Elemental (XPS) | | | | | | |
| % C | | 22.2 | 23.3 | 23.5 | 23.5 | 22.4 |
| % Si | | 32.7 | 35.2 | 35 | 35.1 | 35.3 |
| % O | | 44.3 | 41.1 | 41.2 | 41.4 | 42.3 |
| % F | | 0 | 0 | 0 | 0 | 0 |

Note:
Atomic % hydrogen not determined by XPS for Table 2.

Physical studies of several different films produced in accordance with the invention are tabulated in Table 3 below (Note: Atomic % hydrogen not determined by XPS for Table 3).

TABLE 3

| Example No. | 1 | 2 | 3 | 4 | 5 | 6 | 7 | 8 | 9 | 10 |
|---|---|---|---|---|---|---|---|---|---|---|
| Deposition Rate (nm/min) | 278 | 343 | 197 | 375 | 463 | 953 | 684 | 1260 | 863 | 619 |
| Plasma Power (W) | 400 | 400 | 300 | 700 | 400 | 1000 | 600 | 1000 | 1000 | 600 |
| Spacing (mil) | 320 | 200 | 260 | 200 | 260 | 260 | 260 | 260 | 320 | 200 |
| Chamber Pressure (torr) | 4.0 | 4.0 | 4.0 | 3.25 | 3.80 | 4.0 | 4.0 | 4.0 | 4.0 | 4.0 |
| Time (sec) | 180 | 120 | 150 | 90 | 90 | 45 | 45 | 45 | 45 | 45 |
| Substrate Temp (° C.) | 350 | 350 | 350 | 400 | 400 | 350 | 350 | 350 | 350 | 350 |
| Gas Flow (sccm) | | | | | | | | | | |
| Trimethylsilane | 540 | 540 | 540 | 540 | 370 | 540 | 540 | 540 | 540 | 540 |
| $O_2$ | 90 | 90 | 90 | 100 | 150 | 90 | 150 | 150 | 90 | 90 |
| $SiF_4$ | 250 | 250 | 250 | 100 | 250 | 250 | 250 | 250 | 250 | 250 |
| He post-treatment | | | | | | | | | | |
| Thickness (nm) | 835 | 686 | 493 | 563 | 695 | 715 | 513 | 945 | 647 | 464 |
| Uniformity (+/−) | 6 | 4 | 4 | | | 6 | 5 | 7 | 12 | 3 |
| RI | 1.4194 | 1.433 | 1.4182 | 1.5101 | 1.4356 | 1.527 | 1.436 | 1.455 | 1.499 | 1.453 |
| Uniformity (+/−) | 0.0039 | 0.0024 | 0.0031 | | | 0.0071 | 0.0055 | 0.0112 | 0.0073 | 0.0076 |
| Avg. Cap./Hg (pF) | 31.1 | 37.7 | 50.8 | 48.2 | 40 | 39.3 | 47.8 | 29.8 | 42.4 | 55.1 |
| Dielectric Constant | 3.03 | 3.09 | 3.08 | 3.32 | 3.34 | 3.37 | 3.00 | 3.27 | 3.32 | 3.17 |
| Adhesion (tape pull) | 100% | 100% | 100% | 100% | 100% | 100% | 100% | 100% | 100% | 100% |
| Young's Modulus | 11.0 | 12.9 | 15.8 | 22.2 | 19.8 | 18.0 | 14.6 | 14.0 | 15.7 | 13.5 |
| NI Hardness | 1.9 | 2.2 | 2.5 | 3.4 | 3.3 | 2.8 | 2.3 | 2.3 | 2.4 | 2.2 |
| Elemental (XPS) | | | | | | | | | | |
| % C | | | | | | 20.5 | 12.2 | 14.5 | 19.3 | 17 |
| % Si | | | | | | 34.7 | 34.3 | 32.1 | 33.3 | 33.1 |
| % O | | | | | | 36.4 | 48.4 | 45.8 | 39 | 43.3 |
| % F | | | | | | 7.8 | 4.7 | 7.1 | 7.9 | 5.9 |

TABLE 3-continued

| Example No. | 11 | 12 | 13 | 14 | 15 | 16 | 17 | 18 | 19 | 20 |
|---|---|---|---|---|---|---|---|---|---|---|
| Deposition Rate (nm/min) | 685 | 321 | 625 | 614 | 615 | 279 | 1213 | 436 | 701 | 842 |
| Plasma Power (W) | 600 | 400 | 600 | 600 | 600 | 400 | 1000 | 400 | 400 | 700 |
| Spacing (mil) | 200 | 200 | 260 | 260 | 260 | 320 | 320 | 265 | 200 | 260 |
| Chamber Pressure (torr) | 4.0 | 6.0 | 4.0 | 4.0 | 4.0 | 4.0 | 3.0 | 5.0 | 3.0 | 5.50 |
| Time (sec) | 90 | 90 | 45 | 90 | 90 | 180 | 45 | 45 | 45 | 60 |
| Substrate Temp (° C.) | 350 | 350 | 350 | 350 | 350 | 350 | 400 | 250 | 250 | 350 |
| Gas Flow (sccm) | | | | | | | | | | |
| Trimethylsilane | 540 | 540 | 540 | 540 | 540 | 540 | 540 | 540 | 540 | 370 |
| $O_2$ | 90 | 90 | 90 | 90 | 90 | 90 | 200 | 50 | 200 | 100 |
| $SiF_4$ | 100 | 100 | 250 | 250 | 250 | 250 | 100 | 100 | 540 | 100 |
| He post-treatment | | | | | 20 sec | | | | | |
| Thickness (nm) | 1027 | 481 | 469 | 921 | 923 | 837 | 910 | 327 | 526 | 842 |
| Uniformity (+/−) | 6 | 11 | 6 | 7 | 9 | 8 | 16 | 10 | 7 | 23 |
| RI | 1.449 | 1.403 | 1.452 | 1.432 | 1.458 | 1.416 | 1.475 | 1.444 | 1.432 | 1.4419 |
| Uniformity (+/−) | 0.0074 | 0.0074 | 0.0056 | 0.0068 | 0.0132 | 0.0063 | 0.0059 | 0.0131 | 0.0068 | 0.0059 |
| Avg. Cap./Hg (pF) | 26.7 | 49.8 | 54.7 | 29.6 | 29.6 | 31 | 31 | 71.2 | 50 | 30.9 |
| Dielectric Constant | 3.13 | 2.94 | 3.18 | 3.16 | 3.17 | 3.03 | 3.29 | 2.94 | 3.23 | 3.03 |
| Adhesion (tape pull) | 100% | 100% | 100% | 100% | 100% | 100% | 100% | 100% | 100% | 100% |
| Young's Modulus | 11.1 | 13.8 | 12.9 | 11.8 | 11.8 | 10.6 | 20.6 | 8.3 | 13.4 | 8.0 |
| NI Hardness | 1.7 | 1.6 | 2.1 | 2.0 | 2.0 | 1.8 | 3.4 | 1.3 | 2.3 | 1.3 |
| Elemental (XPS) | | | | | | | | | | |
| % C | 19.6 | 19.5 | 21.6 | 22.3 | 27.1 | 15.4 | 15.8 | 22.9 | 13.8 | 23.8 |
| % Si | 32.6 | 33 | 35.4 | 35 | 32.1 | 35.7 | 35.3 | 35.4 | 35.3 | 34.8 |
| % O | 42.8 | 44.5 | 38.8 | 38.4 | 37.1 | 46 | 46 | 39.4 | 46.8 | 37.9 |
| % F | 4.4 | 2.5 | 4.2 | 4.3 | 3.4 | 2.3 | 2.4 | 2 | 3.7 | 3.5 |

Thickness and refractive index were measured on an SCI Filmtek 2000 Reflectometer, 5 point average. Adhesion was measured by a tape pull test. Young's modulus and nanoindentation hardness were measured on an MTS Nanoindenter. Elemental analysis by XPS was measured after a 30 second Ar sputter. The atomic % values reported in the tables do not include hydrogen.

Figure 2A:
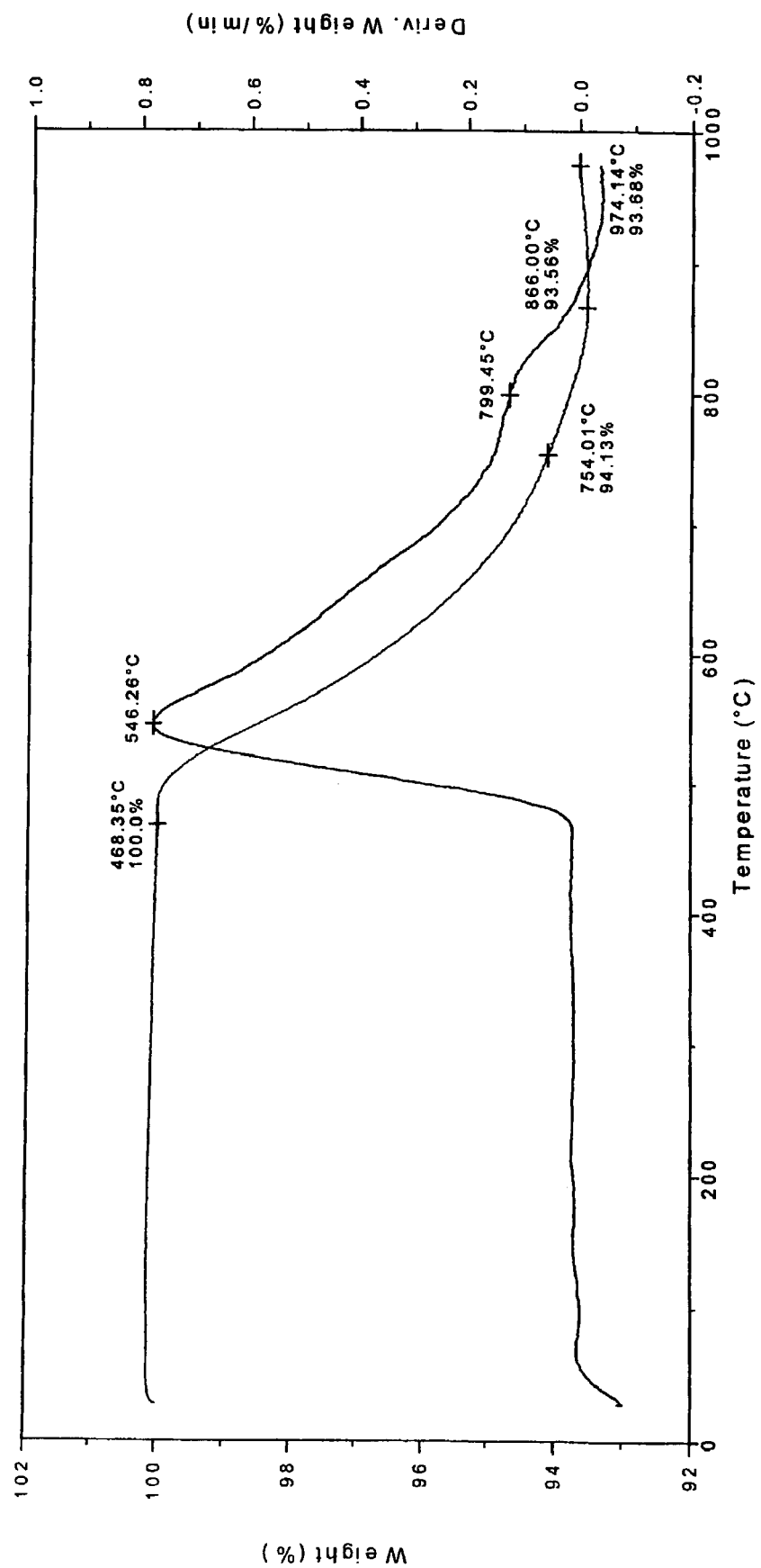
FIG. 2a shows a TGA scan of an embodiment of a film of the invention.
Figure 2B:
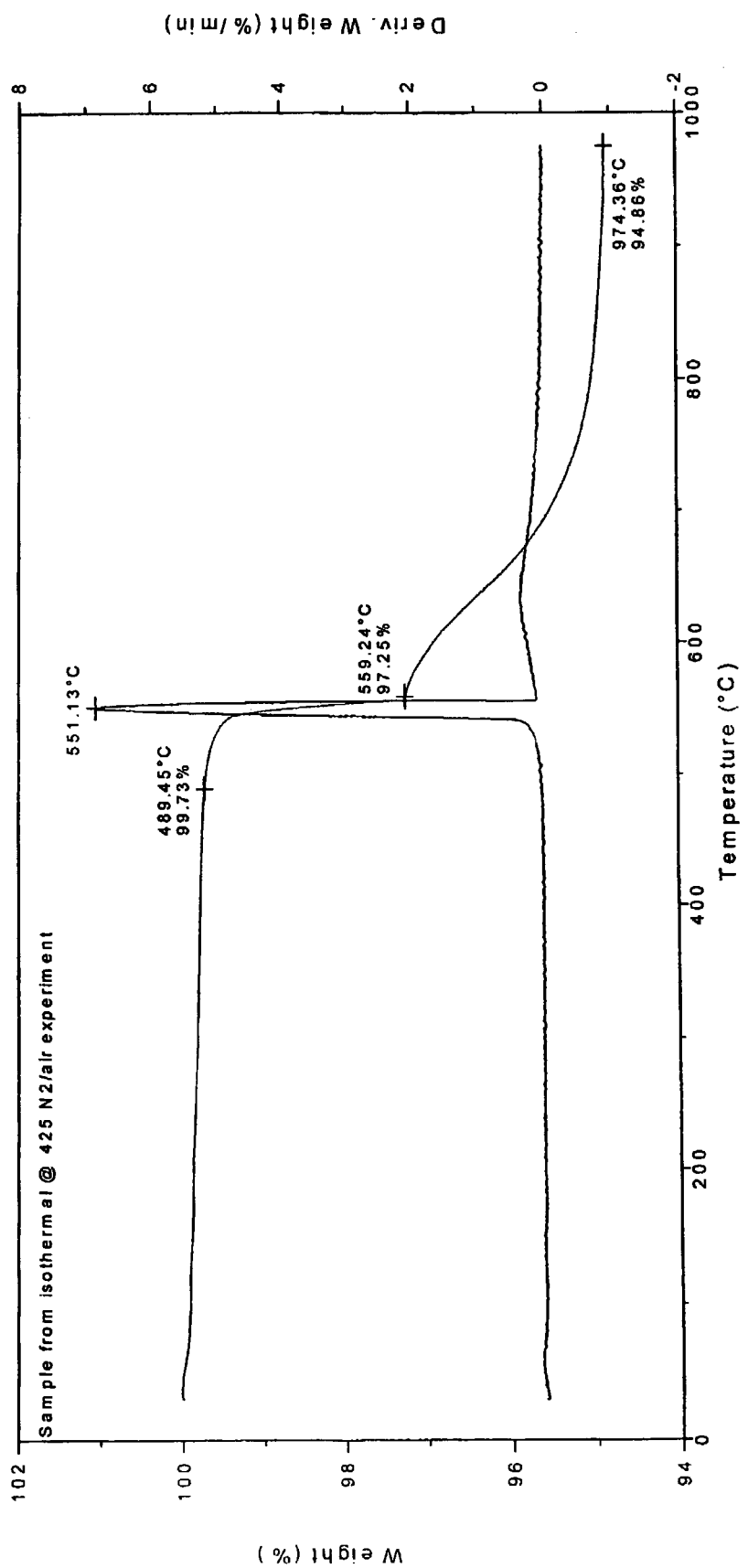
FIG. 2b shows a TGA scan of a prior art film.

FIGS. 1a and 2b show Isothermal TGAs at 425° C. under $N_2$ for 5 hours followed by air. These figures show that the thermal stability of the inventive film (Example 16) is slightly superior to OSG type materials under inert ($N_2$ atmosphere). However, upon switching ambient atmosphere to air, a dramatic and rapid weight loss is seen for the OSG material whereas the film of the invention material shows excellent stability.

FIGS. 2a and 2b show TGA scans in nitrogen or air to 1000° C. after isothermal at 425° C. These figures show the thermal stability of the inventive film (Example 16, shown in FIG. 2a) versus OSG (shown in FIG. 2b) upon scanning to 1000° C. in air. The OSG material shows a much more rapid weight loss starting at about 400° C. when scanning at 10° C./min in nitrogen, whereas the inventive film shows a much less rapid weight loss over an extended period of time and starting only at about 470° C./min when scanned at 10° C./min in air.

Figure 3:
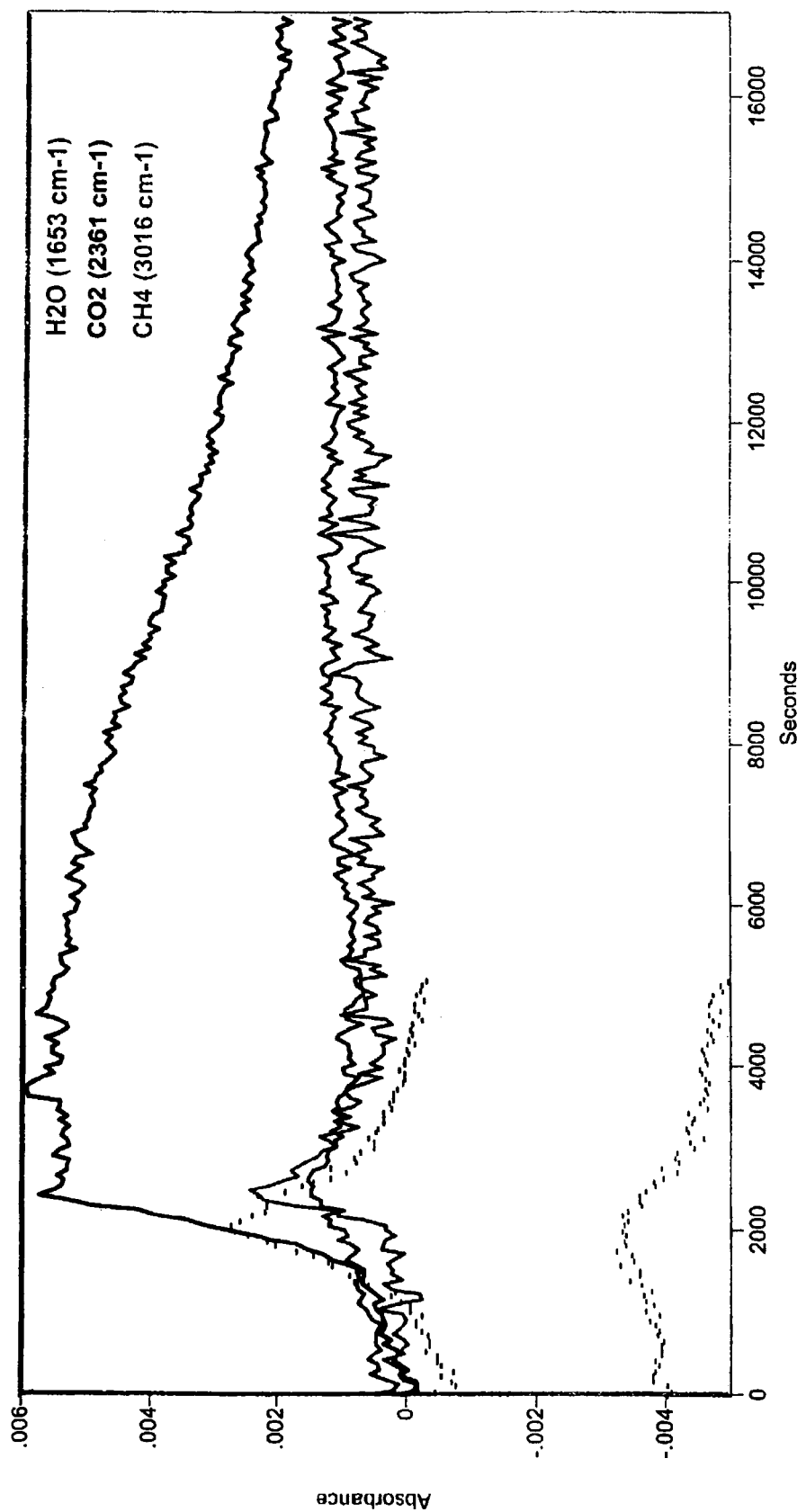
FIG. 3 shows IR profiles of an embodiment of the film of the invention and a prior art film.

FIG. 3 shows IR profiles for the film of Example 16 and OSG at 425° C. isothermal in air. This figure shows that while the inventive film (dotted line profiles) loses only $CO_2$ and water, the OSG material (solid line profiles) losses a substantially larger amount of $CO_2$ as well as water and $CH_4$. There was no indication of any fluorinated organic materials being released from the sample, which would be expected if the material did possess any.

Figure 4:
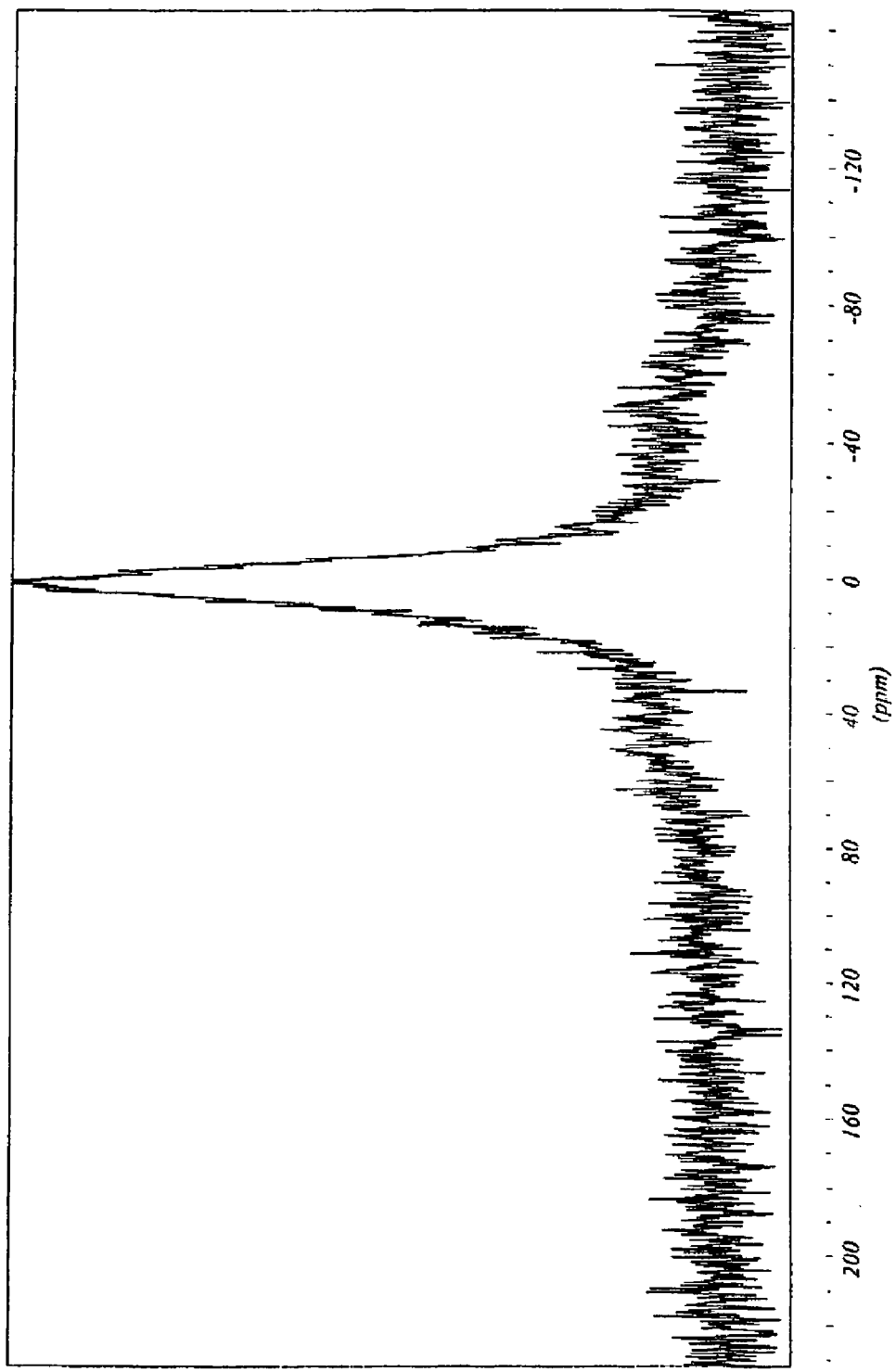
FIG. 4 shows a $^{13}$C NMR spectrum of an embodiment of the film of the invention.

FIG. 4 shows a $^{13}C$ NMR spectrum of the film of Example 16, in which there is no visible sign of organic fluorine, which would be expected to show a signal at about +90 ppm for —$CH_2F$ up to about +150 ppm for —$CF_3$. The only form of carbon seen by this technique is carbon attached to silicon, showing a response centered around 0 ppm.

Thus, the invention provides films and processes for making such films, wherein the films are substantially or completely free of C—F bonds, and have a low dielectric constant and improved mechanical properties, thermal stability, and chemical resistance (to oxygen, aqueous environments, etc.) relative to OSG materials.

Example 21

A prospective example of the invention based on using 1,3,5,7-tetramethylcyclotetrasiloxane (TMCTS) as the organosilane precursor is shown in Table 4 below for a 200 mm silicon wafer substrate.

TABLE 4

| | |
|---|---|
| Pressure (torr) | 4.0 |
| Substrate temperature (° C.) | 350 |
| Spacing (mil) | 250 |
| RF power (Watts) | 300 |
| TMCTS (g/min) | 1.0 |
| $O_2$ flow (sccm) | 50 |
| $SiF_4$ flow (sccm) | 150 |

The expected k value will be in the range of 2.8 to 3.0, with a Young's modulus of about 15 GPa and a nanoindentation hardness of about 2 GPa.

A prospective example of the invention based on using dimethyldimethoxysilane (DMDMOS) as the organosilane precursor is shown in Table 5 below for a 200 mm silicon wafer substrate.

TABLE 5

| | |
|---|---|
| Pressure torr | 4.0 |
| Substrate temperature (° C.) | 350 |
| Spacing (mil) | 250 |
| RF power (Watts) | 500 |
| DMDMOS (g/min) | 1.0 |
| $O_2$ flow (sccm) | 100 |
| $SiF_4$ flow (sccm) | 200 |

The expected k value will be in the range of 2.8 to 3.0, with a Young's modulus of about 15 GPa and a nanoindentation hardness of about 2 GPa.

A prospective example of the invention based on using diethoxymethylsilane (DEMS) as the organosilane precursor is shown in Table 6 below for a 200 mm silicon wafer substrate.

TABLE 6

| | |
|---|---|
| Pressure (torr) | 4.0 |
| Substrate temperature (° C.) | 350 |
| Spacing (mil) | 250 |
| RF power (Watts) | 300 |
| DEMS (g/min) | 1.0 |
| $O_2$ flow (sccm) | 100 |
| $SiF_4$ flow (sccm) | 200 |

The expected k value will be in the range of 2.8 to 3.0, with a Young's modulus of about 15 GPa and a nanoindentation hardness of about 2 GPa.

Example 22

OFSG films of the invention were deposited by combining trimethylsilane (at a flow rate of 1–1000 sccm), $SiF_4$ (at a flow rate of 1–1000 sccm) and $O_2$ (at a flow rate of 1–200 sccm) at a pressure of 1–16 torr, plasma power of 100–1000 Watts, an electrode spacing of 200–400 milli-inches (5.08–10.16 mm), and a temperature of 200–425° C. Comparative OSG films were deposited from gaseous mixtures of trimethylsilane/$O_2$ using similar deposition conditions but without the addition of $SiF_4$.

The precursor structure and composition can greatly influence the chemical structure and composition of thin films deposited by CVD processes. The use of $SiF_4$ as the exclusive source for fluorine may ensure that no C—F bonds are present in the precursor mixture. It is believed that Si—F bonds will be present in the final film because the C—F bond is less likely to form since it is not as thermodynamically stable as the Si—F bond.

The presence of fluorine as $SiF_4$ in the precursor gas mixture may also affect the deposition process. This is most clearly observed as changes in the deposition rate of the films. Compared to an OSG deposition process performed with identical conditions except for the lack of $SiF_4$ in the precursor mixture, the deposition rate for OFSG films that contain $SiF_4$ in the precursor mixture are 30–60% slower. This may arise from surface annealing by fluorine radicals formed during the plasma deposition. A likely effect of this change in deposition process is the removal of weakly bound species from the surface of the films. This makes the OFSG films denser at similar compositions, as shown in Table 7.

TABLE 7

| | OFSG | OSG |
|---|---|---|
| Refractive Index, η | 1.42 | 1.44 |
| Dielectric Constant, κ | 2.86 ± 0.03 | 2.90 ± 0.09 |
| Modulus (GPa) | 12.5 ± 0.5 | 8.0 ± 0.5 |
| Hardness (H, GPa) | 1.67 ± 0.20 | 1.21 ± 0.25 |
| Density (g/cc) | 1.49 | 1.35 |
| Deposition Rate (nm/min) | 330 ± 80 | 890 ± 140 |
| Adhesion (Mpa) | 55 | N/A |
| Elemental (XPS) | | |
| % Si | 36 ± 1 | 36 ± 1 |
| % O | 42 ± 3 | 41 ± 3 |
| % C | 19 ± 3 | 23 ± 3 |
| % H | N/A | N/A |
| % F | 3 ± 1 | n.d. |
| Elemental (RBS) | | |
| % Si | 22 ± 1 | 18 ± 1 |
| % O | 30 ± 3 | 26 ± 3 |
| % C | 18 ± 3 | 21 ± 3 |
| % H | 27 ± 3 | 35 ± 3 |
| % F | 3 ± 1 | n.d. |

Example 23

The thermal stability of films prepared in accordance with Example 22 was studied, with the results summarized in Table 8 below. A comparison between OFSG and OSG film properties before and after annealing for 4 hours at 425° C. under an air atmosphere shows significant differences in their thermal stability. The dielectric constant of the OFSG film increases from 2.89 to 2.96, while that of the OSG film goes from 2.96 to 3.50. The increase in hardness and decrease in refractive index of the OSG film after annealing are indicative of the loss of organic groups that increases the porosity/free volume, concomitant with formation of unwanted chemical bonds, such as Si—OH, that may increase the dielectric constant.

TABLE 8

| Property | OFSG before | OFSG after | OSG before | OSG after |
|---|---|---|---|---|
| Dielectric Constant | 2.89 | 2.96 | 2.96 | 3.50 |
| Modulus (GPa) | 7.20 | 7.66 | 7.85 | 10.64 |
| Hardness (GPa) | 1.25 | 1.30 | 1.30 | 1.43 |
| Refractive Index | 1.401 | 1.398 | 1.424 | 1.401 |

Example 24

The compositional stability of OSG and OFSG films prepared in accordance with Example 22 was evaluated using Dynamic Secondary Ion Mass Spectrometry (Dynamic SIMS) measurements. Two samples were deposited on silicon substrates: the first consisting of a 1.0 micron OFSG film with a 0.5 micron OSG capping layer, and the second a 0.5 micron OSG film with a 0.5 micron OFSG capping layer. Dynamic SIMS depth of profile spectra were performed before and after thermal annealing (4 hr, 425° C., air atmosphere).

Figure 5A:
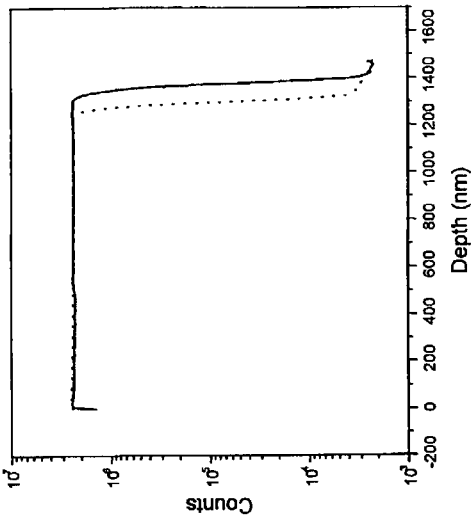
FIGS. 5a, 5b, 5c, 5d, and 5e show Dynamic Secondary Ion Mass Spectrometry depth of profile spectra.
Figure 5B:
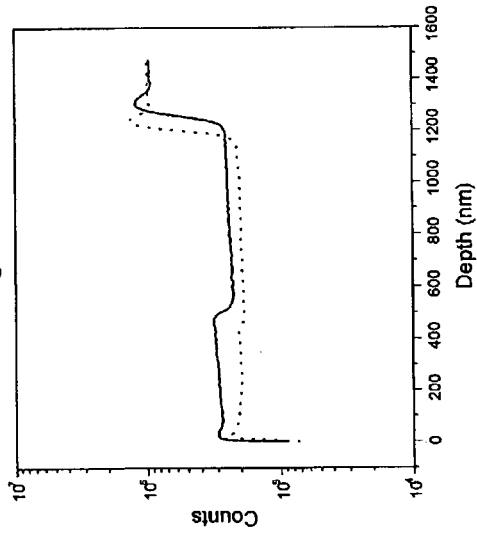
Figure 5E:
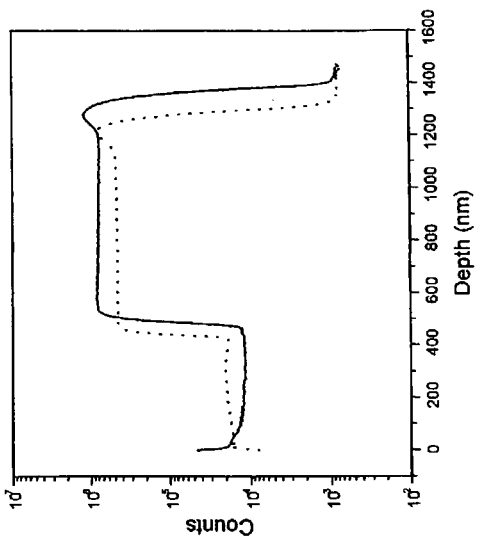
Figure 5D:
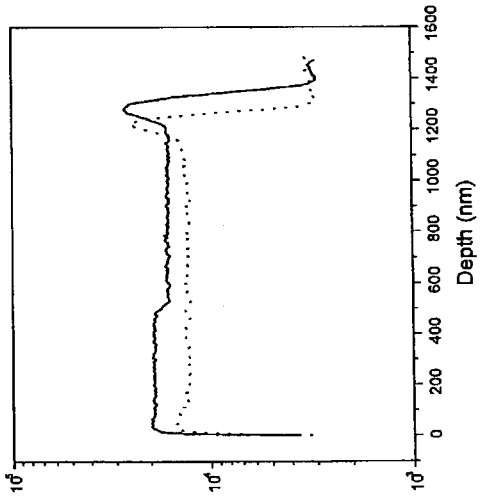
Figure 5C:
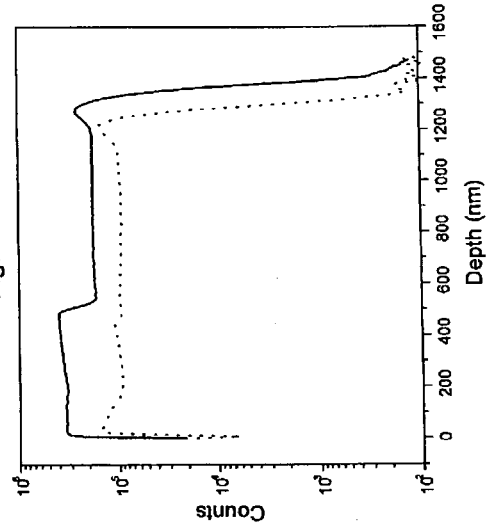

FIGS. 5a–5e show the dynamic SIMS depth of profile measurements for silicon, oxygen, carbon, hydrogen and fluorine, respectively, for a 1.0 micron OFSG film capped with a 0.5 micron OSG film. Dynamic SIMS depth of profile measurements were performed on samples before (solid line) and after (dashed line) thermal annealing to monitor elemental stability during 425° C. thermal anneal in an oxidizing atmosphere. The transition from OSG to OFSG is readily observed for all elements except oxygen. Referring to FIG. 5c, it appears that the carbon may be unstable within the OSG capping layer but highly stable within the OFSG film. FIG. 5e also shows there may be no fluorine migration from the OFSG to OSG layers during annealing. Thus, it is believed that the presence of fluorine within the OFSG composition may improve the stability of the carbon within the film.

Example 25

Figure 6A:
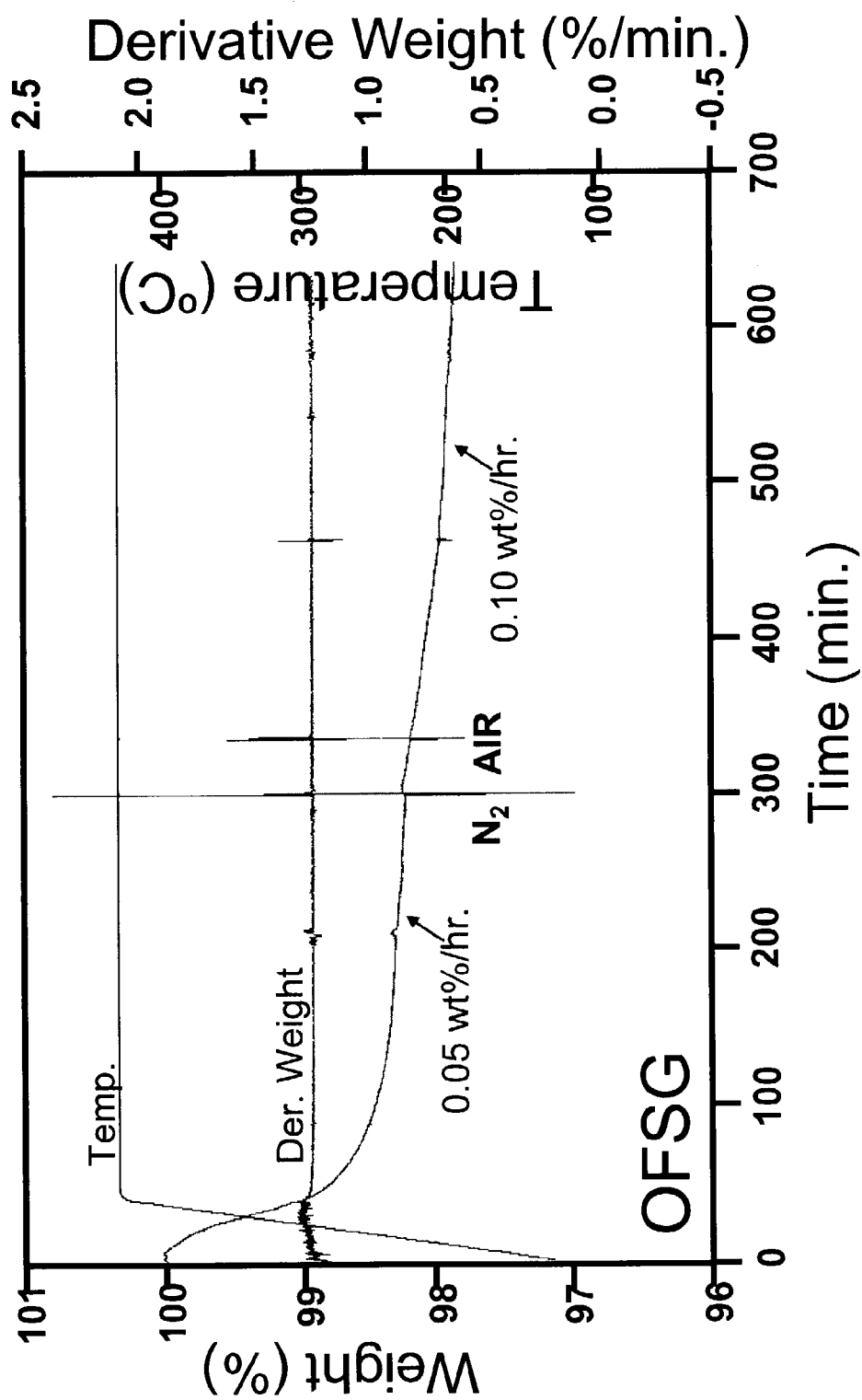
FIGS. 6a and 6b respectively show TGA scans of an OFSG film of the invention and a comparative OSG film.
Figure 6B:
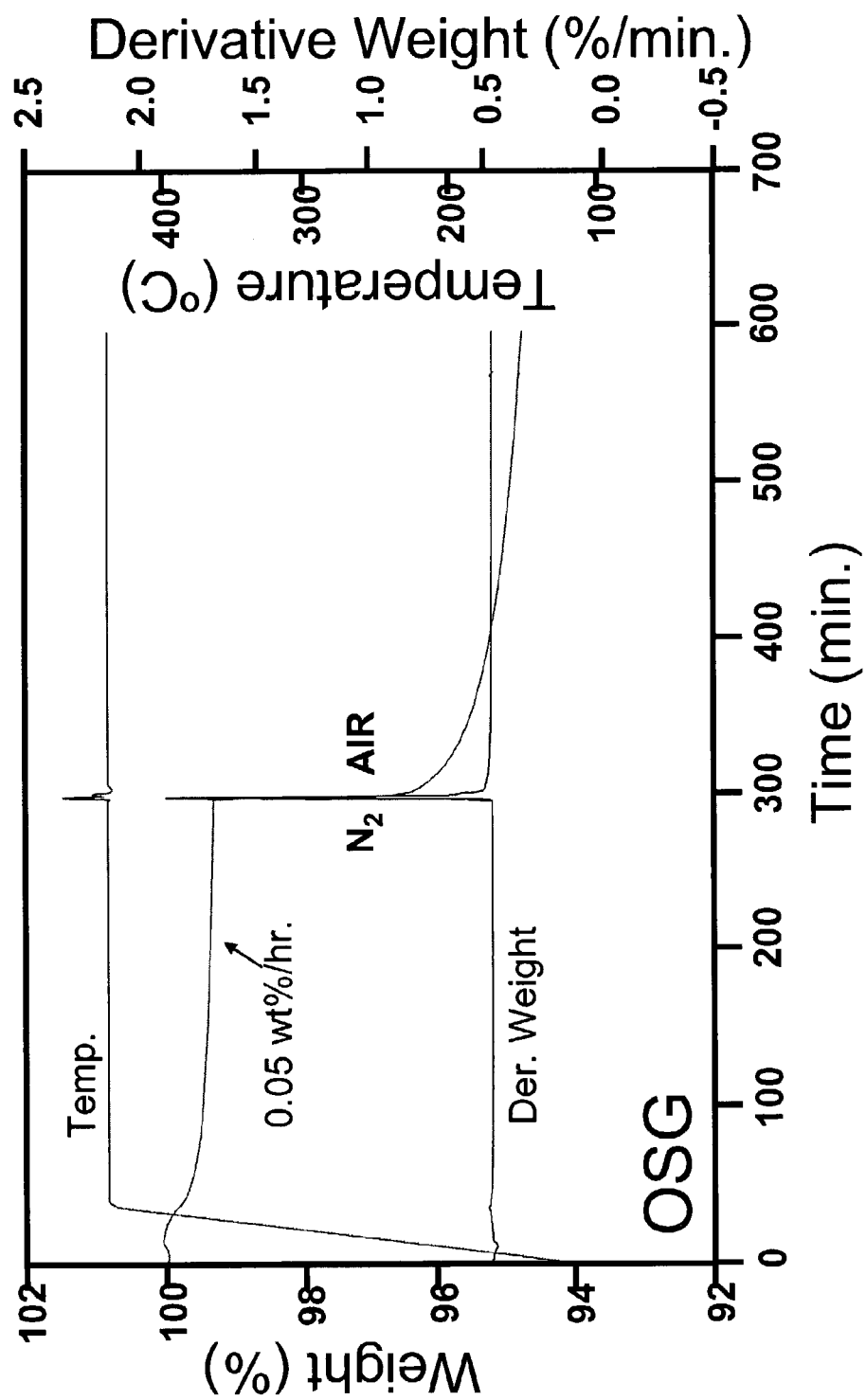

The thermal stability of OSG and OFSG films prepared in accordance with Example 22 was evaluated by measuring weight loss as a function time at 425° C. under nitrogen and air atmospheres. Results for OFSG and OSG films are shown in FIGS. 6a and 6b. The former displays weight loss of 0.05% per hour in nitrogen and 0.10% per hour in air. Analysis of the OSG shows that it loses 0.05% weight loss in nitrogen, but undergoes instantaneous 2% weight loss when exposed to air at 425° C.

Example 26

The compositional stability of OSG and OFSG films prepared in accordance with Example 22 was evaluated using Infrared (IR) Spectroscopy. The deposition conditions for the OFSG film was as follows: plasma power 400W; 200 mils spacing; 6 torr pressure; 350° C. termperature; 540 sccm trimethylsilane; 90 sccm oxygen; 250 sccm silicontetrafluoride; and time of 200 seconds. The deposition conditions for the OSG film was as follows: plasma power 600W; 260 mils spacing; 4 torr pressure; 350° C. termperature; 540 sccm trimethylsilane; 90 sccm oxygen; and time of 72 seconds. IR spectra of OFSG and OSG films before and after thermal annealing (4 hr, 425° C., air atmosphere) are provided in Table 9.

TABLE 9

| | OFSG | OSG |
|---|---|---|
| BEFORE ANNEAL | | |
| Deposition Rate (nm/min) | 270 | 800 |
| Thickness (nm) | 900 | 960 |
| Refractive Index | 1.421 | 1.432 |
| Capacitance (pF) | 28.3 | 26.7 |
| Dielectric Constant | 2.92 | 2.91 |
| AFTER ANNEAL | | |
| Thickness (nm) | 897 | 915 |
| Thickness Change (%) | <0.01 | −4.6 |
| Refractive Index | 1.393 | 1.392 |
| Capacitance (pF) | 28.1 | 28.4 |
| Dielectric Constant | 2.88 | 2.98 |

As the results in Table 9 illustrate, the OFSG film experienced a decrease in capacitance and dielectric constant after thermal annealing. By contrast, the capacitance and dielectric constant of the OSG film increased after thermal annealing.

While the invention has been described in detail and with reference to specific examples thereof, it will be apparent to one skilled in the art that various changes and modifications can be made therein without departing from the spirit and scope thereof.

The invention claimed is:

1. A film represented by the formula $Si_vO_wC_xH_yF_z$, where v+w+x+y+z=100%, v is from 10 to 35 atomic %, w is from 10 to 65 atomic %, y is from 10 to 50 atomic %, x is from 2 to 30 atomic %, and z is from 0.1 to 15 atomic %, wherein substantially none of the fluorine is bonded to the carbon and wherein substantially all of the carbon is bonded to silicon.

2. The film of claim 1, wherein most of the hydrogen is bonded to the carbon.

3. The film of claim 1, having a dielectric constant of less than 3.5.

4. The film of claim 1, having a dielectric constant of less than 3.0.

5. The film of claim 1, having superior mechanical properties relative to a reference OSG film.

6. The film of claim 1, having a bulk density of less than 2.0 g/cc.

7. The film of claim 1, having a bulk density of less than 1.5 g/cc.

8. The film of claim 1, having a pore size less than 5 nm equivalent spherical diameter, as determined by small angle neutron scattering or positron annihilation lifetime spectroscopy.

9. The film of claim 1, having a pore size less than 2.5 nm equivalent spherical diameter, as determined by small angle neutron scattering or positron annihilation lifetime spectroscopy.

10. The film of claim 1, deposited on a semiconductor substrate.

11. The film of claim 1 wherein the film is at least one of the group consisting of an insulation layer, an interlayer dielectric layer, an intermetal dielectric layer, a capping layer, a chemical-mechanical planarization layer or etch stop layer, a barrier layer or an adhesion layer in an integrated circuit.

12. The film of claim 1, having an average weight loss of less than 1.0 wt %/hr isothermal at 425° C. under $N_2$.

13. The film of claim 1, having an average weight loss of less than 1.0 wt %/hr isothermal at 425° C. under air.

14. The film of claim 1, having a bulk density of less than 1.5 g/cc, a pore size less than 2.5 nm equivalent spherical diameter, as determined by small angle neutron scattering or positron annihilation lifetime spectroscopy, wherein most of the hydrogen is bonded to the carbon, and the film is deposited on a substrate as at least one of the group consisting of an insulation layer, an interlayer dielectric layer, an intermetal dielectric layer, a capping layer, a chemical-mechanical planarization or etch stop layer, a barrier layer, or an adhesion layer in an integrated circuit.

15. The film of claim 1, wherein x/z>0.25.

16. A film represented by the formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, provided that x/z>0.25, wherein substantially none of the fluorine is bonded to the carbon and wherein substantially all of the carbon is bonded to silicon.

17. The film of claim 16, having a bulk density of less than 1.5 g/cc, a pore size less than 2.5 nm equivalent spherical diameter, as determined by small angle neutron scattering or positron annihilation lifetime spectroscopy, wherein most of the hydrogen is bonded to the carbon, and the film is deposited on a substrate as at least one of the group consisting of an insulation layer, an interlayer dielectric layer, an intermetal dielectric layer, a capping layer, a chemical-mechanical planarization or etch stop layer, a barrier layer or an adhesion layer in an integrated circuit.

18. A film represented by the formula $Si_vO_wC_xH_yF_z$, where v+w+x+y+z=100%, v is from 10 to 35 atomic %, w is from 10 to 65 atomic %, y is from 10 to 50 atomic %, x is from 2 to 30 atomic %, and z is from 0.1 to 15 atomic % wherein .5 atomic % or less of the fluorine is bonded to the carbon, 0.5 atomic % or greater of the carbon is bonded to silicon, and wherein the film is adapted to resist alteration of a film property by an environmental condition.

19. The film of claim 18, wherein the environmental condition is a microelectronic processing step.

20. The film of claim 19, wherein the microelectronic processing step is chemically oxidative and/or thermally oxidative.

21. The film of claim 18, wherein the film property is a dielectric constant and the environmental condition is at least one microelectronic processing step selected from the group consisting of a thermal annealing step, a dielectric etching step and a post-etch ashing step.

22. The film of claim 21, wherein the environmental condition increases the dielectric constant by 10% or less.

23. The film of claim 21, wherein the environmental condition increases the dielectric constant by 0.1 or less.

24. The film of claim 21, wherein the environmental condition increases the dielectric constant by less than an amount by which the environmental condition increases a reference dielectric constant of a reference OSG film.

25. The film of claim 24, wherein the environmental condition increases the dielectric constant by 50% or less of an amount by which the environmental condition increases a reference dielectric constant of a reference OSG film.

26. The film of claim 25, wherein the environmental condition increases the dielectric constant by 20% or less of an amount by which the environmental condition increases a reference dielectric constant of a reference OSG film.

27. The film of claim 18, wherein the film property is a distribution of fluorine throughout the film.

28. The film of claim 18, wherein the film property is a concentration of carbon in the film.

29. The film of claim 28, wherein the environmental condition decreases the concentration of carbon in the film by 50% or less of an amount by which the environmental condition decreases a reference dielectric constant of a reference OSG film.

30. The film of claim 29, wherein the environmental condition decreases the concentration of carbon in the film and wherein the environmental condition decreases the concentration of carbon in the film by 20% or less of an amount by which the environmental condition decreases a reference dielectric constant of a reference OSG film.

31. A film represented by the formula $Si_vO_wC_xH_yF_z$, where v+w+x+y+z=100%, v is from 10 to 35 atomic %, w is from 10 to 65 atomic %, y is from 10 to 50 atomic %, x is from 1 to 30 atomic %, and z is from 0.1 to 15 atomic %, provided that x/z>0.25, wherein 0.5 atomic % or less of the fluorine is bonded to the carbon, 0.5 atomic % or greater of the carbon is bonded to silicon, and wherein the film is adapted to resist alteration of a film property by a microelectronic processing step.

* * * * *